(12) United States Patent
Kuo et al.

(10) Patent No.: US 10,199,761 B1
(45) Date of Patent: Feb. 5, 2019

(54) SIGNAL TRANSMISSION ASSEMBLY AND FLOATING CONNECTOR

(71) Applicant: GREENCONN CORP., New Taipei (TW)

(72) Inventors: Tsung-Lung Kuo, Taipei (TW); Jiun-Fu Ke, New Taipei (TW)

(73) Assignee: GREENCONN CORP., New Taipei (TW)

( * ) Notice: Subject to any disclaimer, the term of this patent is extended or adjusted under 35 U.S.C. 154(b) by 0 days.

(21) Appl. No.: 15/821,179

(22) Filed: Nov. 22, 2017

(51) Int. Cl.
| | |
|---|---|
| *H01R 13/405* | (2006.01) |
| *H01R 12/71* | (2011.01) |
| *H01R 13/08* | (2006.01) |
| *H01R 12/91* | (2011.01) |
| *H01R 13/631* | (2006.01) |
| *H05K 1/18* | (2006.01) |

(52) U.S. Cl.
CPC ......... *H01R 13/405* (2013.01); *H01R 12/716* (2013.01); *H01R 12/91* (2013.01); *H01R 13/08* (2013.01); *H01R 13/6315* (2013.01); *H05K 1/181* (2013.01); *H05K 2201/10189* (2013.01)

(58) Field of Classification Search
CPC .... H01R 13/405; H01R 13/08; H01R 12/716; H01R 12/91; H01R 13/28; H01R 13/6315; H05K 1/81; H05K 2201/10189
USPC ........................................ 439/76.1, 247, 248
See application file for complete search history.

(56) References Cited

U.S. PATENT DOCUMENTS

| | | | | |
|---|---|---|---|---|
| 7,125,260 B2 * | 10/2006 | Orita | .................... | H01R 12/57 439/74 |
| 7,637,762 B2 * | 12/2009 | Uesaka | .................. | H01R 12/57 439/247 |
| 7,758,366 B2 * | 7/2010 | Masuda | ................. | H01R 12/82 439/247 |
| 7,878,829 B2 * | 2/2011 | Yang | ................... | H01R 13/6315 439/247 |
| 7,887,350 B2 * | 2/2011 | Fukazawa | ............ | H01R 12/707 439/247 |

(Continued)

FOREIGN PATENT DOCUMENTS

JP   WO 2016042625 A1 *  3/2016  .......... H01R 13/631

*Primary Examiner* — Tulsidas C Patel
*Assistant Examiner* — Travis Chambers
(74) *Attorney, Agent, or Firm* — Li & Cai Intellectual Property (USA) Office

(57) ABSTRACT

A floating connector includes an insulating housing, a plurality of conductive terminals installed on the insulating housing, and two soldering members. The insulating housing includes an inserting portion, two extending portions respectively connected to two opposite ends of the inserting portion, and two covering portions respectively located at the two extending portions. The inner walls of each covering portion and the corresponding extending portion co-define a limiting slot having a limiting wall and two limiting holes arranged facing the limiting wall. The two soldering members are respectively and movably arranged in the two limiting slots. Each soldering member includes a beam facing the corresponding limiting wall, two elastic arms connected to the beam and respectively arranged in the two corresponding limiting holes, and two soldering tails respectively connected to two opposite ends of the beam and passing through the corresponding limiting slot.

8 Claims, 15 Drawing Sheets

(56) References Cited

U.S. PATENT DOCUMENTS

| | | | | |
|---|---|---|---|---|
| 8,845,349 B2* | 9/2014 | Shindo | ............... | H01R 13/6315 |
| | | | | 439/247 |
| 9,033,722 B2* | 5/2015 | Kobayashi | ........... | H01R 12/712 |
| | | | | 439/248 |
| 9,178,326 B2* | 11/2015 | Funayama | ............. | H01R 12/91 |
| 9,484,656 B2* | 11/2016 | Doi | ........................ | H01R 12/65 |
| 2007/0202729 A1* | 8/2007 | Uesaka | .................. | H01R 12/57 |
| | | | | 439/248 |
| 2010/0055952 A1* | 3/2010 | Fukazawa | ............ | H01R 12/707 |
| | | | | 439/248 |
| 2013/0280968 A1* | 10/2013 | Kurita | ...................... | H01R 4/48 |
| | | | | 439/863 |
| 2016/0204536 A1* | 7/2016 | Doi | ........................ | H01R 12/65 |
| | | | | 439/248 |

* cited by examiner

SIGNAL TRANSMISSION ASSEMBLY AND FLOATING CONNECTOR

BACKGROUND OF THE INVENTION

1. Field of the Invention

The present disclosure relates to a connector; in particular, to a signal transmission assembly, a floating connector, and a soldering member of a floating connector.

2. Description of Related Art

A conventional floating connector includes an inserting chamber and a plurality of conductive terminals installed in the inserting chamber, the inserting chamber is movable relative to the conductive terminals, and the conductive terminals provide an elastic force to the inserting chamber for achieving a shockproof effect. However, the shockproof effect of the conventional floating connector has been limited due to difficulties in improving the structure of the conductive terminal.

SUMMARY OF THE INVENTION

The present disclosure provides a signal transmission assembly, a floating connector, and a soldering member of a floating connector to solve the drawback associated with conventional floating connectors.

The present disclosure provides a signal transmission assembly, which includes a circuit board and a floating connector fixed on the circuit board. The floating connector includes an insulating housing, a plurality of conductive terminals, and two soldering members. The insulating housing includes an inserting portion, two extending portions, and two covering portions. The two extending portions are respectively connected to two opposite sides of the inserting portion. The two covering portions are respectively located at the two extending portions. Each of the two covering portions and the corresponding extending portion surround and define a limiting slot having a limiting wall and two limiting holes facing the limiting wall. The conductive terminals are fastened to the insulating housing. Each of the conductive terminals includes a first part arranged in the inserting portion and a second part unconnected to the inserting portion. The two soldering members are respectively and movably installed in the two limiting slots. Each of the two soldering members includes a beam, two elastic arms, and two soldering tails. The beam faces the limiting wall of the corresponding limiting slot. The two elastic arms are connected to the beam and each have a free end portion. The free end portions of the two elastic arms are respectively and movably inserted into the two limiting holes of the corresponding limiting slot. The two soldering tails are respectively connected to two opposite ends of the beam and pass through the corresponding limiting slot. The conductive terminals and the soldering tails of the two soldering members are soldered on the circuit board, and the beam of each of the two soldering members is spaced apart from the corresponding limiting wall. When the insulating housing is moved relative to the circuit board, each of the elastic arms is pressed to provide an elastic force to the insulating housing.

The present disclosure also provides a floating connector, which includes an insulating housing, a plurality of conductive terminals, and two soldering members. The insulating housing includes an inserting portion, two extending portions respectively connected to two opposite sides of the inserting portion, and two covering portions respectively located at the two extending portions. Each of the two covering portions and the corresponding extending portion surround and define a limiting slot having a limiting wall and two limiting holes facing the limiting wall. The conductive terminals are fastened to the inserting portion of the insulating housing. The two soldering members are respectively and movably installed in the two limiting slots. Each of the two soldering members includes a beam facing the limiting wall of the corresponding limiting slot, two elastic arms connected to the beam and each having a free end portion, and two soldering tails respectively connected to two opposite ends of the beam and passing through the corresponding limiting slot. The free end portions of the two elastic arms are respectively and movably inserted into the two limiting holes of the corresponding limiting slot.

The present disclosure further provides a soldering member of a floating connector. The soldering member includes a beam having an elongated shape, two elastic arms connected to at least one of two opposite long edges of the beam and arranged apart from each other, and two soldering tails respectively connected to two opposite ends of the beam. Each of the two elastic arms includes an elastic portion curvedly connected to the beam and a free end portion extending from the elastic portion, and the elastic portion of each of the two elastic arms includes at least one S-shaped structure.

In summary, the signal transmission assembly, the floating connector, and the soldering member of the present disclosure can be provided for improving the shockproof effect of the floating connector by the cooperation of the soldering member and the insulating housing, in which when the insulating housing is moved relative to the circuit board, each of the elastic arms is pressed to provide an elastic force to the insulating housing.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Reference is made to FIGS. 1 to 15, which illustrate an embodiment of the present disclosure. References are hereunder made to the detailed descriptions and appended drawings in connection with the present disclosure. However, the appended drawings are merely provided for exemplary purposes, and should not be construed as restricting the scope of the present disclosure.

Figure 1:
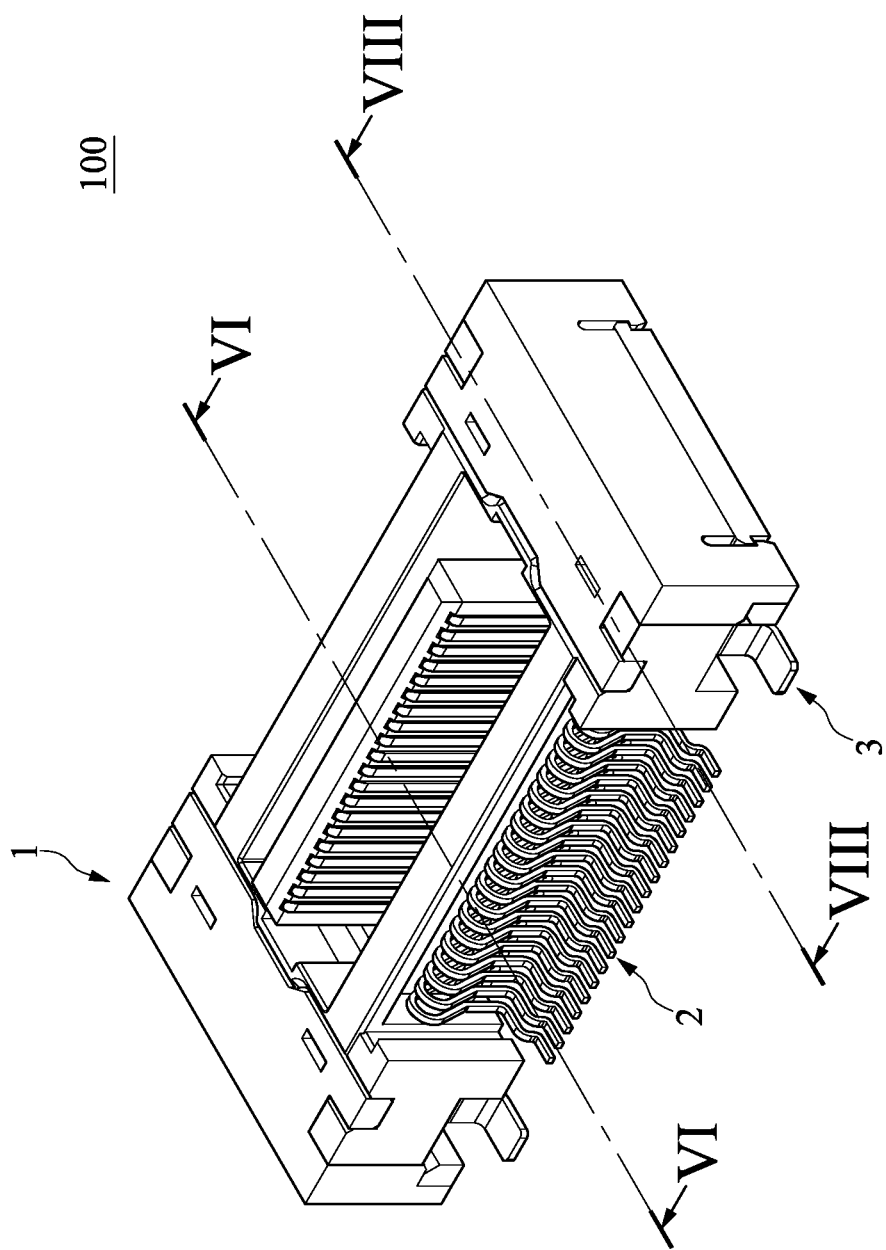
FIG. 1 is a perspective view showing a floating connector according to the present disclosure.
Figure 2:
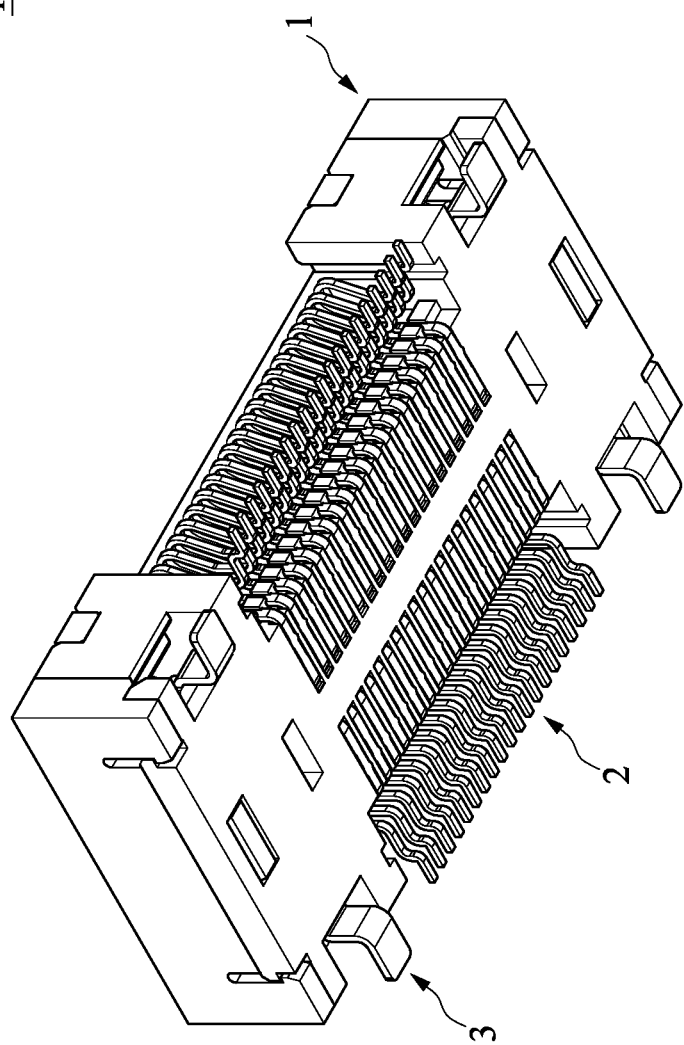
FIG. 2 is a perspective view of FIG. 1 from another perspective.

As shown in FIGS. 1 and 2, the present embodiment provides a floating connector 100 for inserting into a mating connector (not shown) and being applied to a movable object (e.g., a car). When the floating connector 100 is moved relative to the mating connector, the structural design of the floating connector 100 can firmly maintain the electrical connection between the floating connector 100 and the mating connector.

The floating connector 100 of the present embodiment includes an insulating housing 1, a plurality of conductive terminals 2 fastened to the insulating housing 1, and two soldering members 3 movably arranged in the insulating housing 1. The soldering members 3 in the present embodiment are cooperated with the insulating housing 1, but the present disclosure is not limited thereto. That is to say, the soldering member 3 can also be applied with other components. The following description discloses the structure and connection of each component of the floating connector 100 when the floating connector 100 is not soldered on any object.

Figure 3:
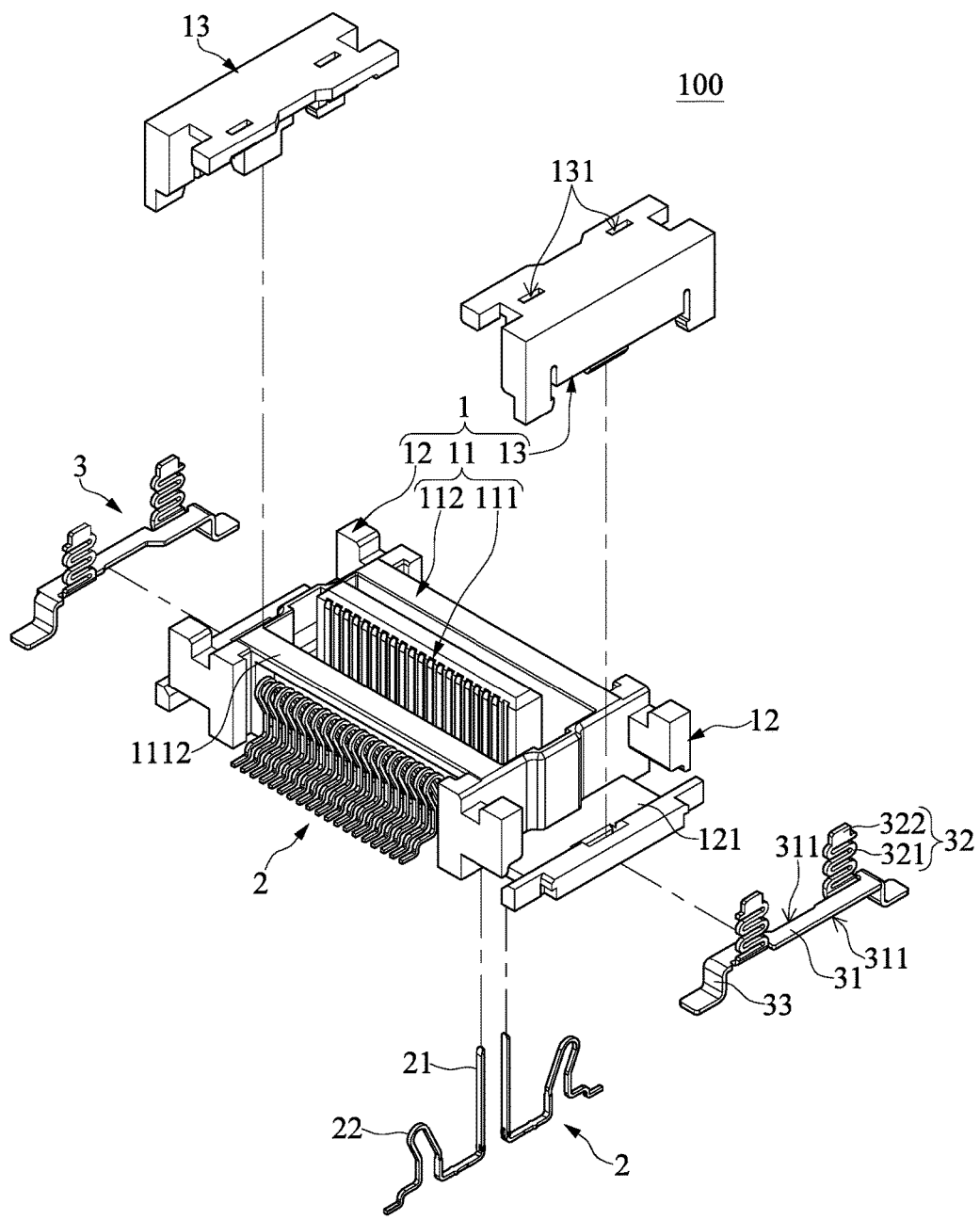
FIG. 3 is an exploded view of FIG. 1.

As shown in FIGS. 2 and 3, the insulating housing 1 includes an elongated inserting portion 11, two extending portions 12 respectively connected to two opposite sides of the inserting portion 11, and two covering portions 13 respectively located at the two extending portions 12. In the present embodiment, the inserting portion 11 and the two extending portions 12 are integrally formed as one piece, and the two covering portions 13 are respectively and detachably fastened to the two extending portions 12. In other words, the covering portion 13 in the present embodiment is like a cover fastened to the corresponding extending portion 12 in a direction from an upper side to a lower side, but the structure of the insulating housing 1 is not limited thereto. For example, in other embodiments of the present disclosure, the insulating housing 1 can be formed integrally as one piece.

Moreover, while each of the two covering portions 13 in the present embodiment is connected to the corresponding extending portion 12 in a buckling manner, the manner of connection between each of the covering portions 13 and the corresponding extending portion 12 can be changed according to design requirements and is not limited to the present embodiment.

Figure 8:
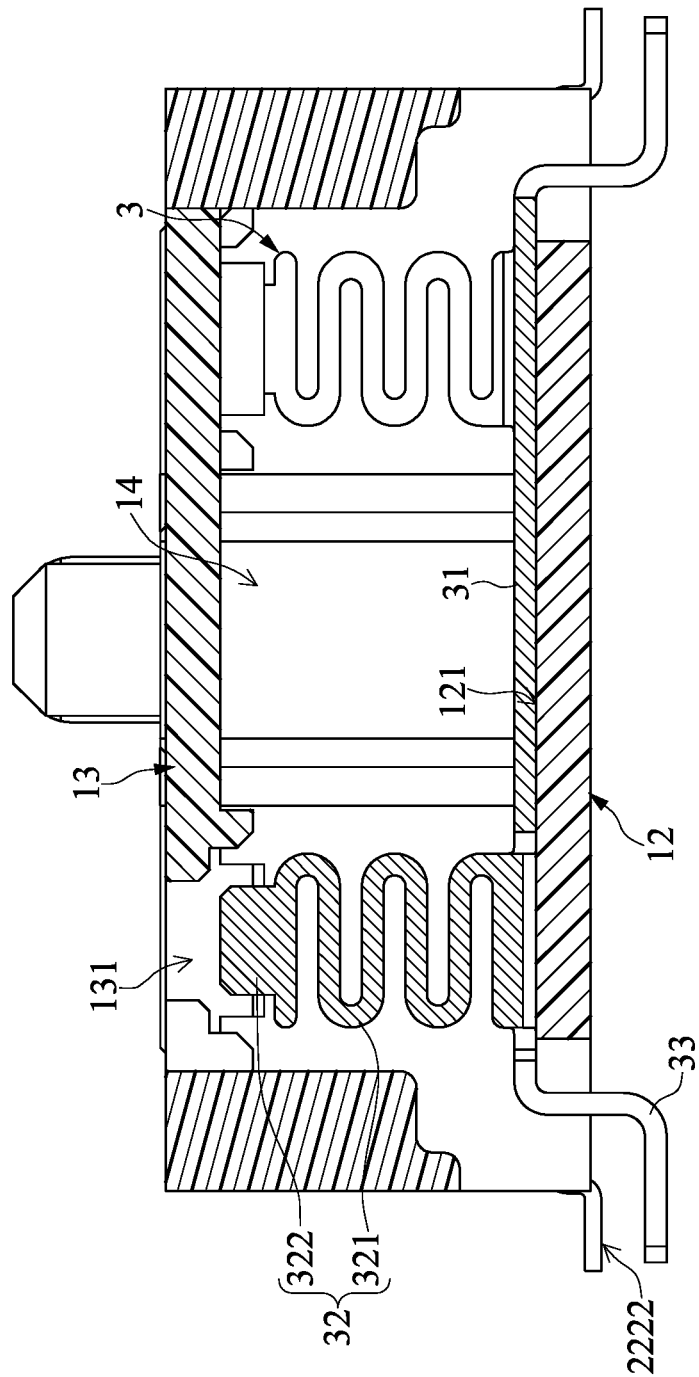
FIG. 8 is a cross-sectional view taken along the cross-sectional line VIII-VIII of FIG. 1.

Specifically, each of the two covering portions 13 and the corresponding extending portion 12 surround and define a limiting slot 14 (as shown in FIG. 8), in which the limiting slot 14 has a limiting wall 121 and two limiting holes 131 facing the limiting wall 121. In each of the two covering portions 13 and the corresponding extending portion 12 of the present embodiment, the two limiting holes 131 are penetratingly recessed in the covering portion 13, and the limiting wall 121 is arranged on the extending portion 12, but the present disclosure is not limited thereto. For example, in other embodiments of the present disclosure, the covering portion 13 can be detachably fastened to the extending portion 12 in a direction from a lower side to an upper side, the two limiting holes 131 can be penetratingly recessed in the extending portion 12, and the limiting wall 121 can be arranged on the covering portion 13.

In addition, the inserting portion 11 includes an inserting slot 111 and a tongue plate 112 perpendicularly extending from a bottom of the inserting slot 111 and protruding from the inserting slot 111. The inserting slot 111 includes a bottom wall 1111 and two side walls 1112 respectively and perpendicularly connected to two long side edges of the bottom wall 1111. Each of the two side walls 1112 has a plurality of fixing portions 1113 formed on an outer surface thereof adjacent to the bottom wall 1111.

The fixing portions 1113 of each of the two side walls 1112 are arranged in one row parallel to a longitudinal direction of the inserting portion 11. In the present embodiment, the outer surface of each of the two side walls 1112 has an elongated rib arranged adjacent to the bottom wall 1111. Each of the ribs has a plurality of notches recessed from a lower side to an upper side thereof, and each of the notches is defined as one fixing portion 1113, but the structure of each fixing portion 1113 is not limited thereto.

Figure 4:
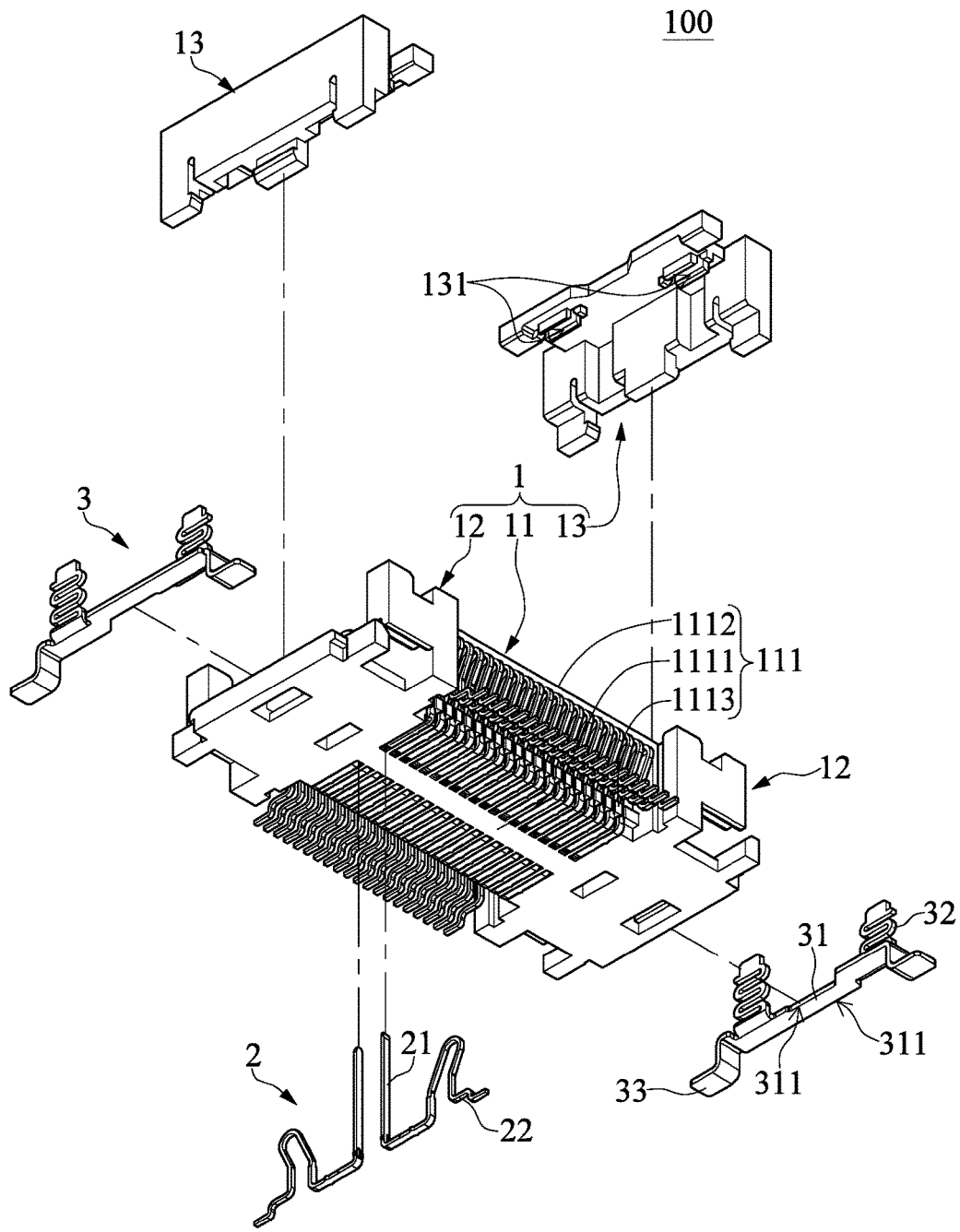
FIG. 4 is an exploded view of FIG. 2.

As shown in FIGS. 3 and 4, the conductive terminals 2 are respectively fastened to the fixing portions 1113 of the inserting portion 11 and are arranged in two rows each parallel to the longitudinal direction of the inserting portion 11. Each of the conductive terminals 2 includes a first part 21 arranged in the inserting portion 11 and a second part 22 unconnected to the inserting portion 11.

As the conductive terminals 2 in the present embodiment are of the same structure, the following description only discloses the structure of one of the conductive terminals 2 and a corresponding portion of the inserting portion 11 (i.e., a corresponding portion of the tongue plate 112 and the corresponding fixing portion 1113) for the sake of brevity. However, in other embodiments of the present disclosure, the conductive terminals 2 can be formed in different structures.

Figure 5:
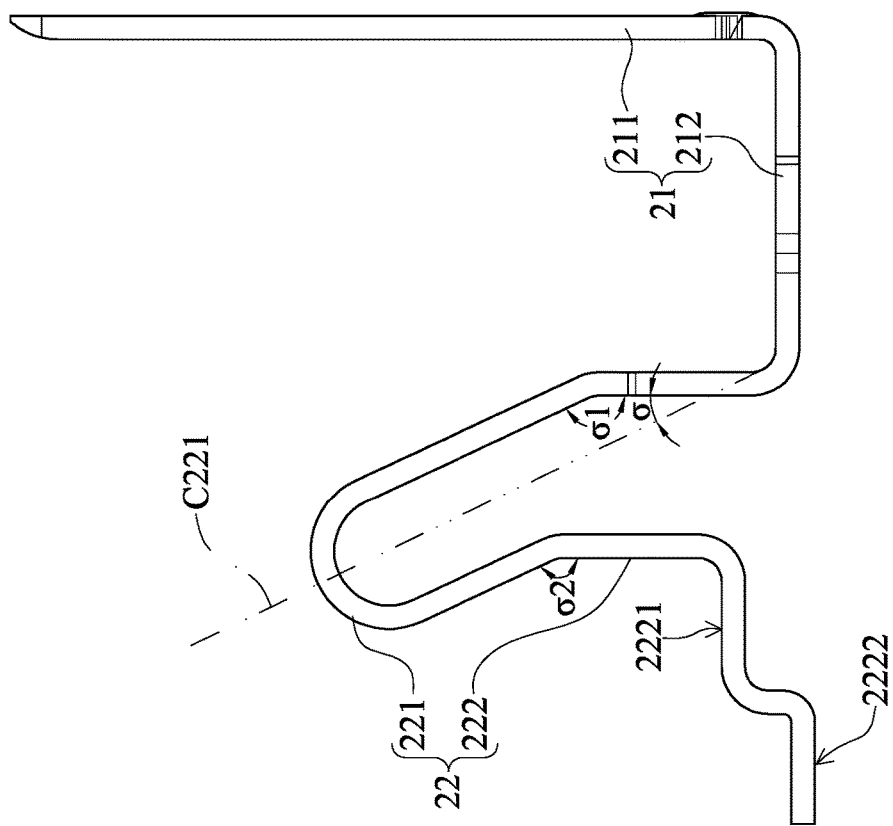
FIG. 5 is a planar view showing a conductive terminal of the floating connector according to the present disclosure.
Figure 6:
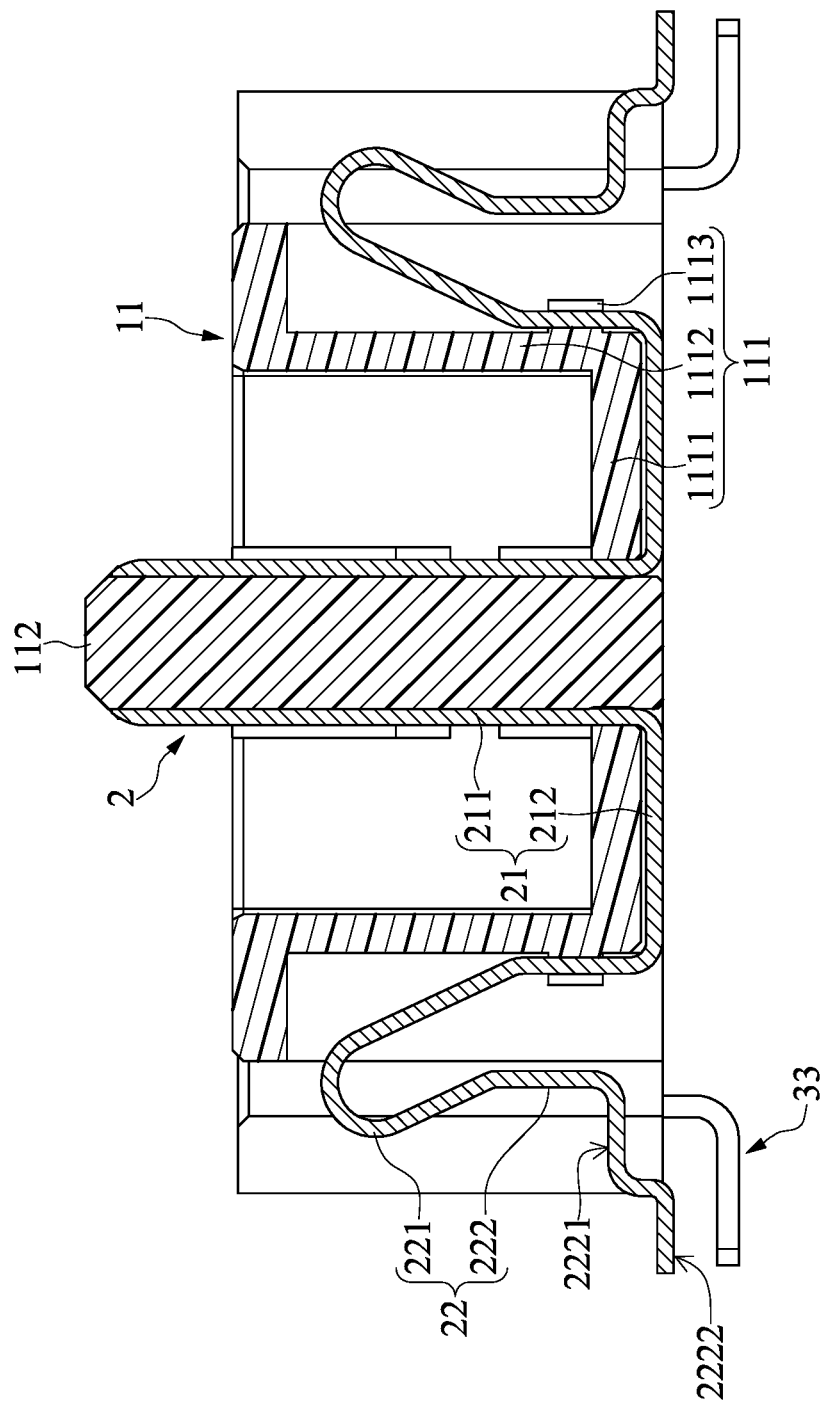
FIG. 6 is a cross-sectional view taken along the cross-sectional line VI-VI of FIG. 1.

As shown in FIGS. 5 and 6, the conductive terminal 2 is formed integrally as one piece, the first part 21 includes a contact segment 211 and a curved segment 212, and the second part 22 includes an elastic segment 221 and a fixing segment 222. That is to say, the curved segment 212 has a first end (i.e., the right end of the curved segment 212 as shown in FIG. 5) connected to the contact segment 211 and an opposite second end (i.e., the left end of the curved segment 212 as shown in FIG. 5), and two opposite ends of the elastic segment 221 are respectively connected to the second end of the curved segment 212 and the fixing segment 222.

Specifically, the contact segment 211 is embedded in the tongue plate 112, and a surface of the contact segment 211 is exposed from the tongue plate 112 for connecting a terminal of the mating connector. A first side portion of the curved segment 212 (i.e., the inner side portion of the curved segment 212 as shown in FIG. 6) connected to the contact segment 211 is engaged in the bottom wall 1111. A bottom portion of the curved segment 212 is engaged with a bottom surface of the bottom wall 1111. A second side portion of the curved segment 212 (i.e., the outer side portion of the curved segment 212 as shown in FIG. 6) is engaged with the corresponding fixing portion 1113. It should be noted that the curved segment 212 in the present embodiment is engaged with the corresponding fixing portion 1113, but the connection of the curved segment 212 and the corresponding fixing portion 1113 in the present disclosure can be changed according to design requirements.

The elastic segment 221 is arranged outside the inserting portion 11, and the elastic segment 221 in the present embodiment is substantially a U-shape. A central axis C221 of the elastic segment 221 and the second side portion of the curved segment 212 (or an inserting direction of the floating connector 100) have an acute angle σ within a range of 30-60 degrees. Moreover, a corner formed by the elastic segment 221 and the curved segment 212 has a first angle σ1 within a range of 120-150 degrees, a corner formed by the elastic segment 221 and the fixing segment 222 has a second angle σ2, and a difference between the first angle σ1 and the second angle σ2 is smaller than or equal to 5 degrees. In the present embodiment, the first angle σ1 is substantially equal to the second angle σ2, but the present disclosure is not limited thereto.

The fixing segment 222 is arranged outside the inserting portion 11, and the fixing segment 222 in the present embodiment has a structure suitable for the surface mounting technology (SMT), but the present disclosure is not limited thereto. For example, in other embodiments of the present disclosure, the fixing segment 222 can have a structure suitable for inserting into and being soldered on an object (e.g., a circuit board). Moreover, the fixing segment 222 has a step surface 2221 and a fixing surface 2222 respectively arranged on two opposite sides thereof (i.e., the top side and the bottom side of the fixing segment 222 as shown in FIG. 5). The step surface 2221 and the fixing surface 2222 are substantially parallel to each other and have a distance there-between, and the step surface 2221 is higher than the fixing surface 2222.

Figure 7:
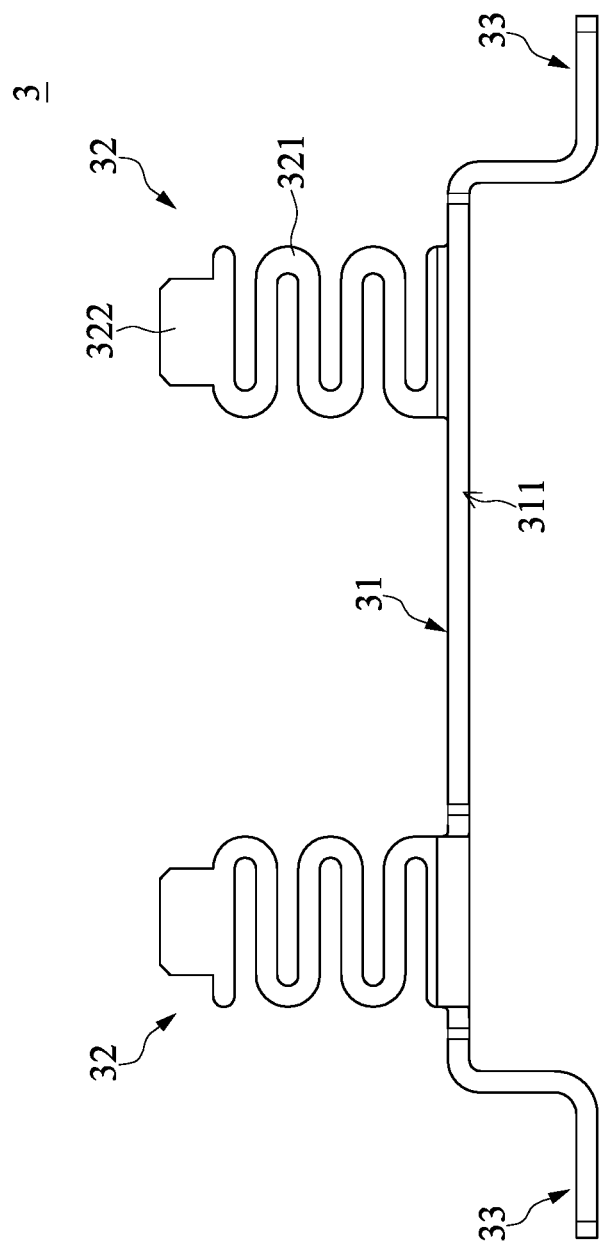
FIG. 7 is a planar view showing a soldering member of the floating connector according to the present disclosure.

As shown in FIGS. 3, 7, and 8, the two soldering members 3 are respectively and movably installed in the two limiting slots 14. As the two soldering members 3 in the present embodiment are of the same structure, the following description only discloses the structure of one of the two soldering members 3 and the corresponding limiting slot 14 (i.e., the corresponding limiting wall 121 and the corresponding limiting holes 131) for the sake of brevity. However, in other embodiments of the present disclosure, the two soldering members 3 can be formed in different structures.

The soldering member 3 is formed integrally as one piece and includes an elongated beam 31, two elastic arms 32 connected to the beam 31, and two soldering tails 33 respectively connected to two opposite ends of the beam 31 (i.e., the left end and the right end of the beams 31 as shown in FIG. 7).

A longitudinal direction of the beam 31 is substantially perpendicular to the arrangement direction of each row of the conductive terminals 2, and the beam 31 has two opposite long edges 311. Each of the two elastic arms 32 has a free end portion 322 and an elastic portion 321 connected to the beam 31 and the free end portion 322. The two elastic arms 32 are respectively connected to the two long edges 311 of the beam 31, each of the two elastic portions 321 curvedly extends (i.e., perpendicularly extends) from the corresponding long edge 311 of the beam 31, and the two elastic arms 32 are preferably in a staggered arrangement with respect to the beam 31.

Specifically, each of the two elastic portions 321 includes at least one S-shaped structure. In the present embodiment, each of the two elastic portions 321 is formed by two S-shaped structures, which are in a head-to-tail connection, and the S-shaped structures of the two elastic portions 321 face in two opposite directions, but the present disclosure is not limited thereto. For example, in other embodiments of the present disclosure, the structure of the elastic portion 321 can be formed differently.

In addition, the beam 31 faces the limiting wall 121 of the corresponding limiting slot 14, and when the floating connector 100 is not soldered on any object, the beam 31 is disposed on the corresponding limiting wall 121. Each of the free end portions 322 is arranged away from the two soldering tails 33, and the free end portions 322 are respectively and movably inserted into the two limiting holes 131 of the corresponding limiting slot 14. Specifically, the free end portion 322 and a part of the elastic portion 321 of each of the two elastic arms 32 are movable to be inserted into the corresponding limiting hole 131.

The two soldering tails 33 are respectively and perpendicularly connected to two opposite ends of the beam 31, and the two soldering tails 33 are substantially in a mirror arrangement with respect to the beam 31. Each of the two soldering tails 33 has an L-shape and passes through the corresponding limiting slot 14, and a bottom surface of each of the two soldering tails 33 is lower than the fixing surface 2222 of each conductive terminal 2.

It should be noted that the soldering tail 33 in the present embodiment is suitable for the surface mounting technology (SMT), but the present disclosure is not limited thereto. For example, in other embodiments of the present disclosure, the soldering tail 33 can be a structure suitable for inserting into and being soldered on an object.

The above description discloses the floating connector 100 prior to being soldered on any object. The floating connector 100 of the present embodiment can be fixed on (or soldered on) a circuit board 200 to form a signal transmission assembly 1000 (as shown in FIGS. 9 to 12). The floating connector 100 in the present embodiment is cooperated with the circuit board 200, but the present disclosure is not limited thereto. That is to say, the floating connector 100 can also be applied with other components.

The following description discloses a forming process of the signal transmission assembly 1000 for describing the structure of the floating connector 100 after being soldered on the circuit board 200.

As shown in FIGS. 9 to 12, the floating connector 100 in the present embodiment is disposed on the circuit board 200, in which the fixing surfaces 2222 of the conductive terminals 2 and the bottom surfaces of the soldering tails 33 of the two soldering members 3 are disposed on the corresponding pads of the circuit board 200, and then the floating connector 100 and the circuit board 200 are heated to solder the floating connector 100 onto the circuit board 200. Specifically, before the floating connector 100 is soldered on the circuit board 200, the beam 31 of each soldering member 3 is disposed on the corresponding limiting wall 121, and the bottom surface of each soldering tail 33 is lower than the fixing surface 2222 of each conductive terminal 2, so that when the fixing surface 2222 of each conductive terminal 2 and the bottom surface of each soldering tail 33 are disposed on the circuit board 200, the beam 31 of each soldering member 3 is moved upwardly and away from the corresponding limiting wall 121, and the two free end portions 322 of each soldering member 3 are more deeply inserted into the two corresponding limiting holes 131.

The forming process of the signal transmission assembly 1000 has been disclosed in the above description, and the following description will disclose the structure and connection of the signal transmission assembly 1000.

The conductive terminals 2 and the soldering tails 33 of the two soldering members 3 are soldered on the circuit board 200, and the beam 31 of each of the two soldering members 3 is spaced apart from the corresponding limiting wall 121. Thus, when the insulating housing 1 is moved relative to the circuit board 200, each of the elastic arms 32 is pressed to provide an elastic force to the insulating housing 1, thereby improving the shockproof effect of the signal transmission assembly 1000 (or the floating connector 100).

Figure 9:
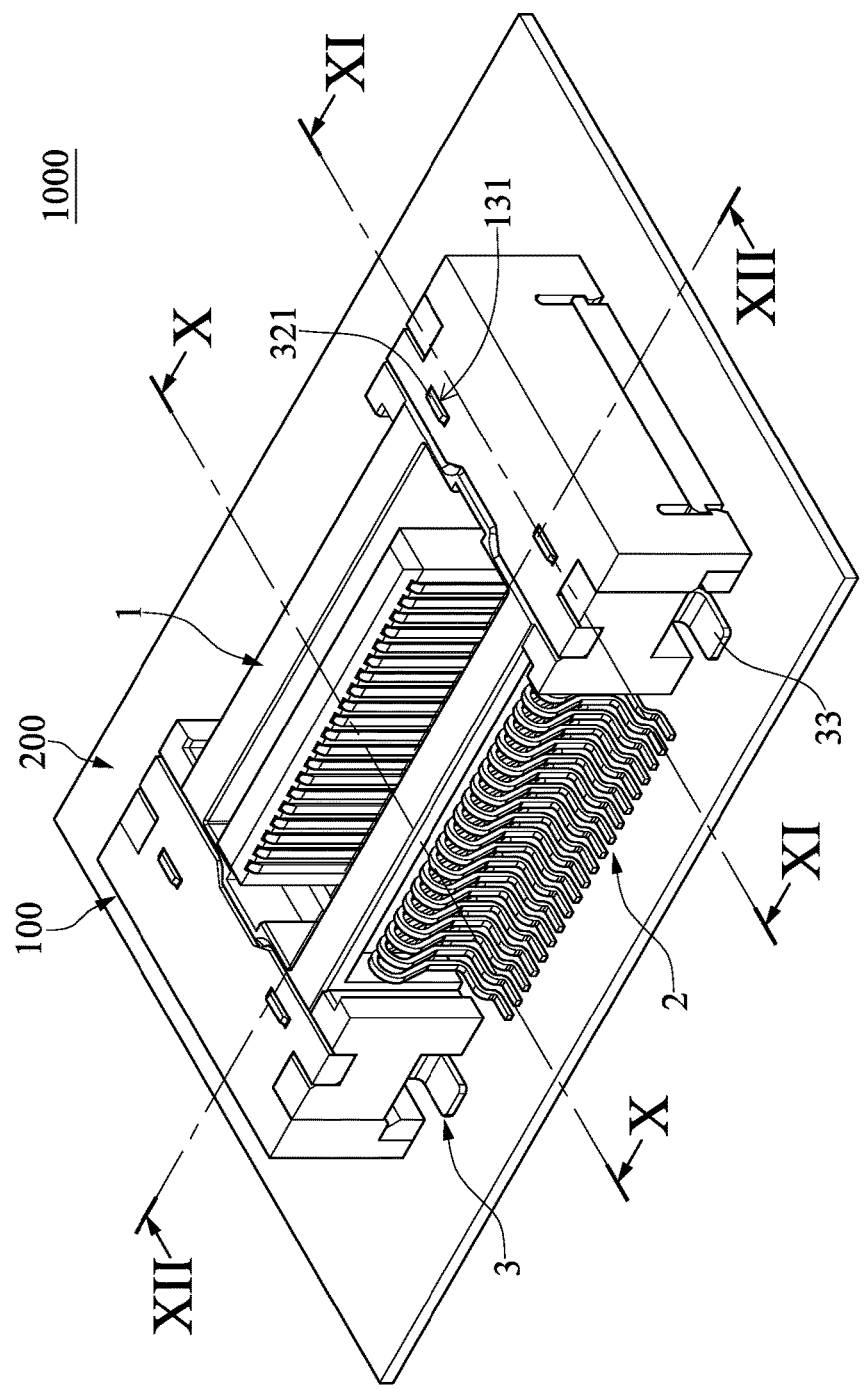
FIG. 9 is a perspective view showing a signal transmission assembly according to the present disclosure.
Figure 10:
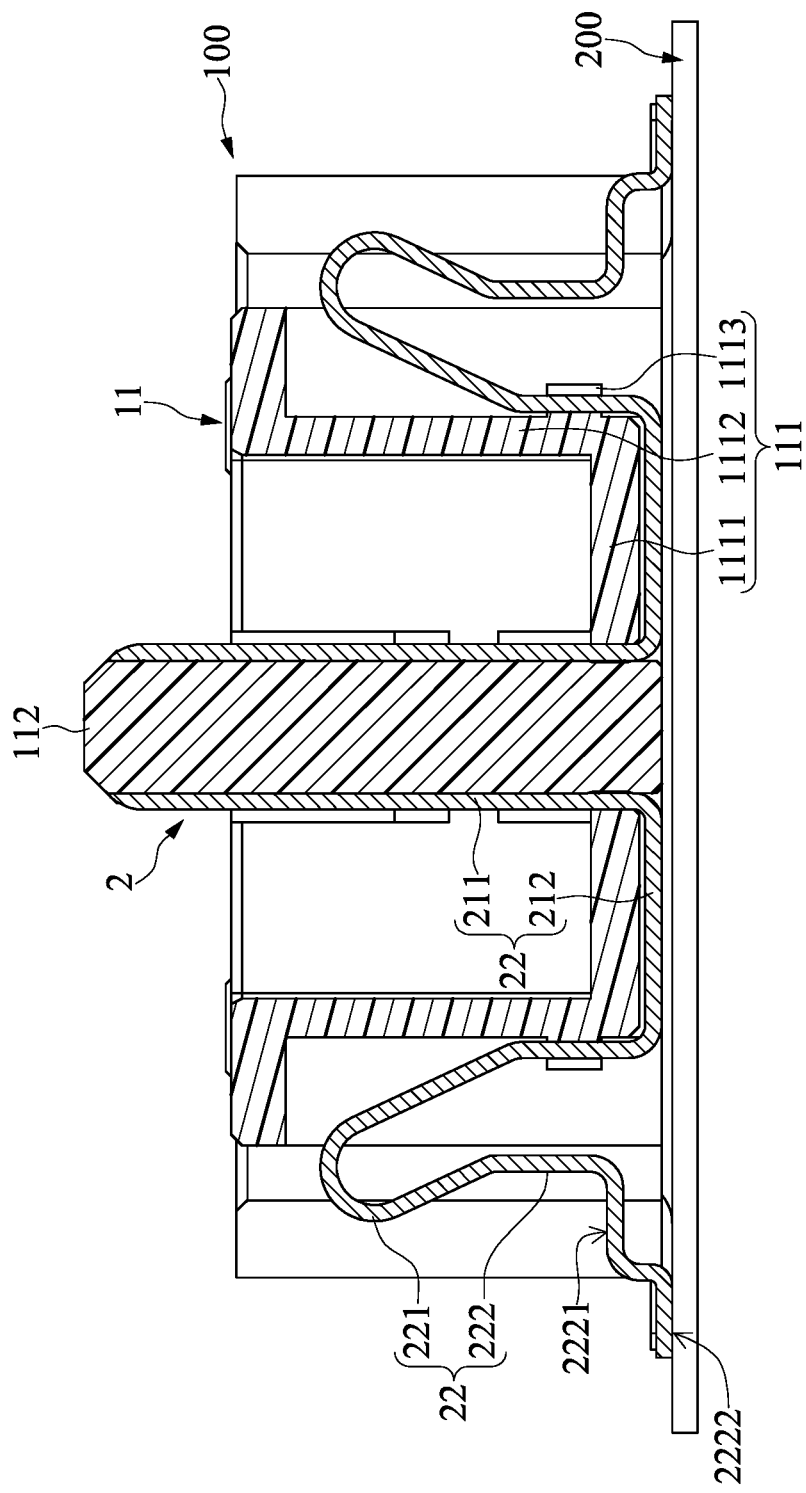
FIG. 10 is a cross-sectional view taken along the cross-sectional line X-X of FIG. 9.
Figure 11:
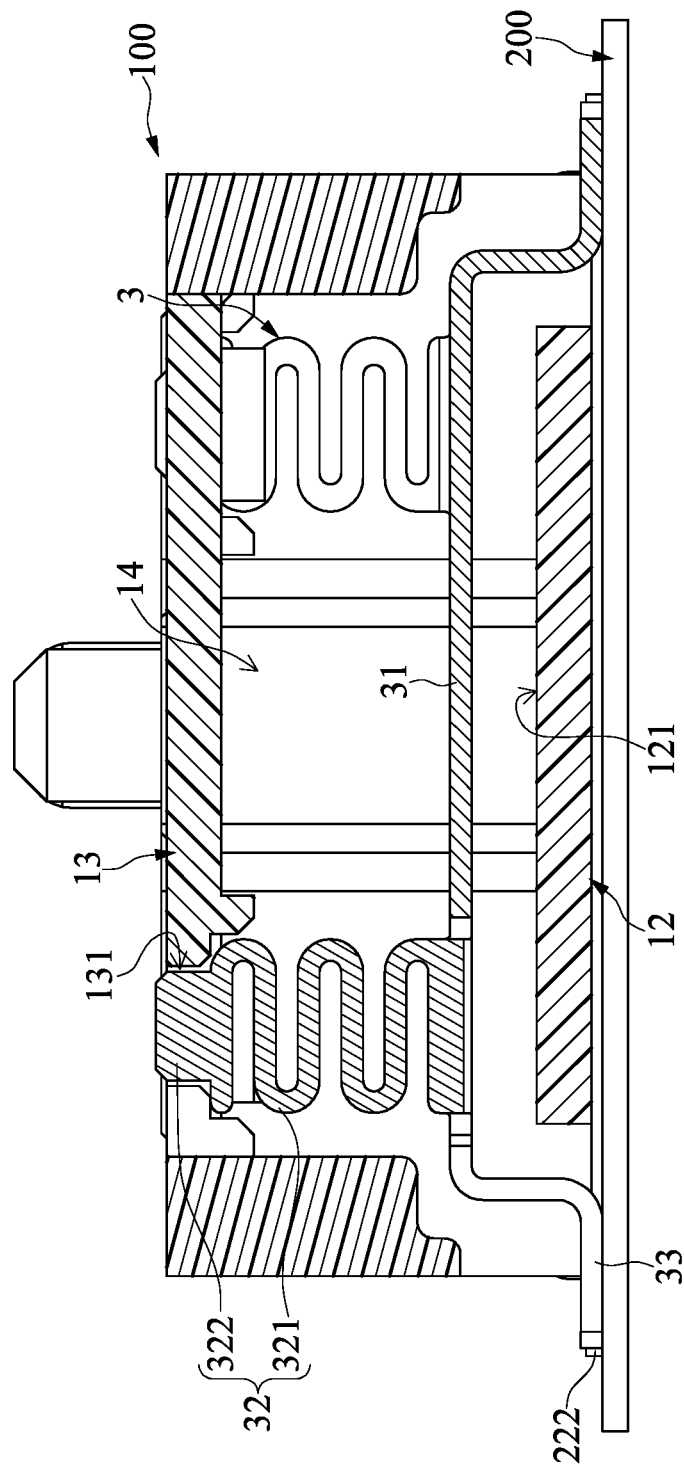
FIG. 11 is a cross-sectional view taken along the cross-sectional line XI-XI of FIG. 9.
Figure 12:
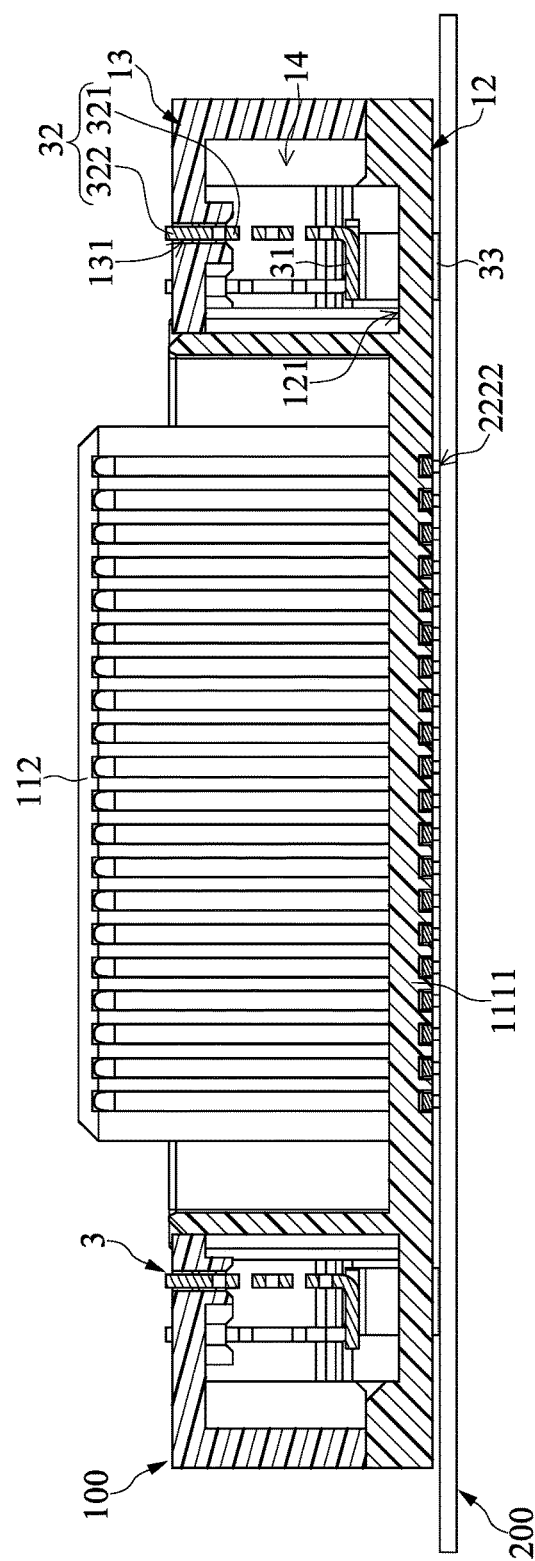
FIG. 12 is a cross-sectional view taken along the cross-sectional line XII-XII of FIG. 9.

Specifically, in each soldering member 3 of the present embodiment, each of the free end portions 322 and a part of the connected elastic portion 321 are arranged in the corresponding limiting hole 131, and a part of each of the free end portions 322 (i.e., the top part of the free end portion 322 as shown in FIG. 9) protrudes from the corresponding limiting hole 131. Each of the free end portions 322 and an inner wall defining the corresponding limiting hole 131 have a gap (as shown in FIG. 12) which is smaller than a thickness of each free end portion 322, thereby preventing excessive movement of each free end portion 322 in the corresponding limiting hole 131.

Figure 13:
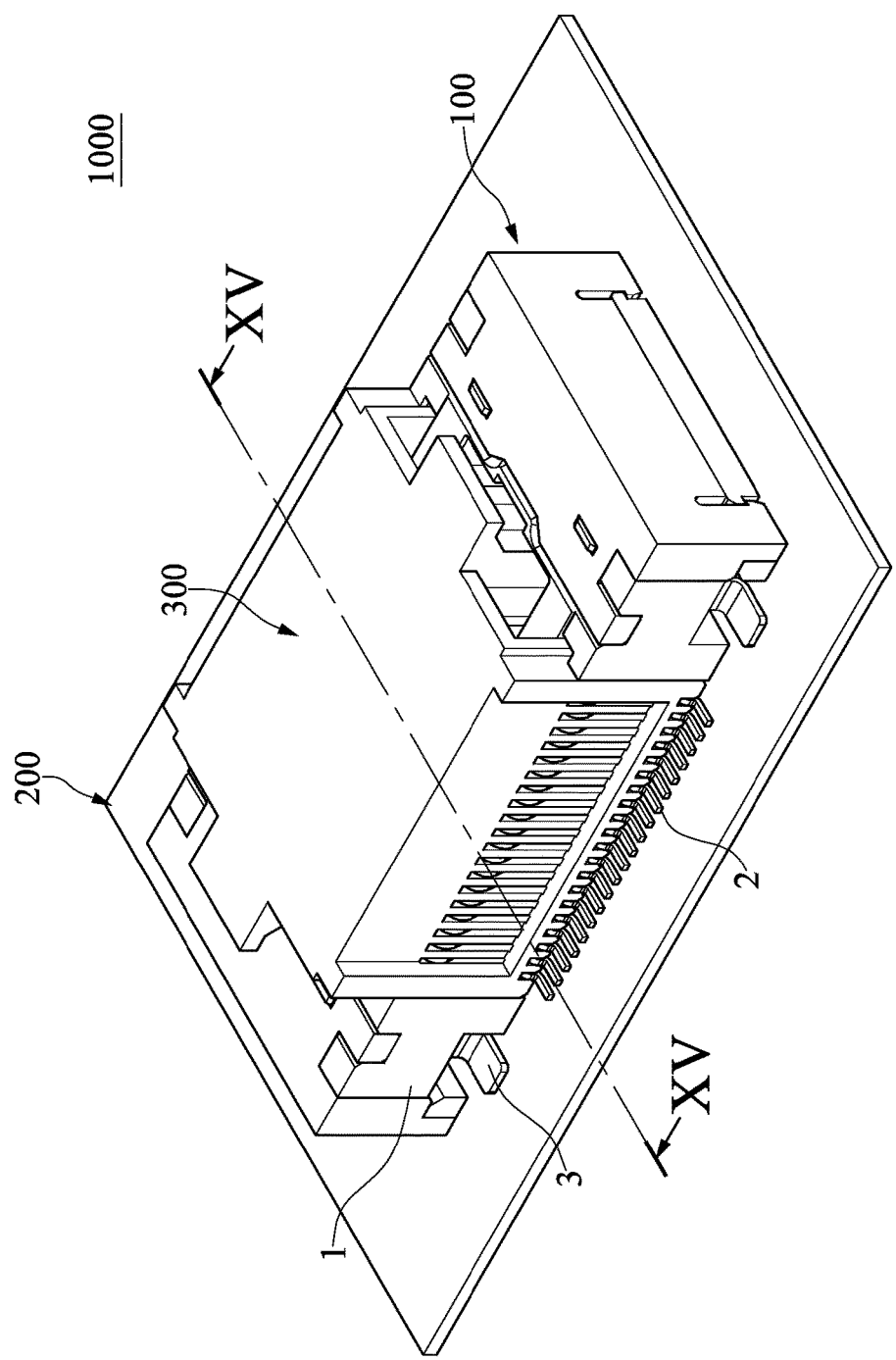
FIG. 13 is a perspective view showing the signal transmission assembly having a holder according to the present disclosure.
Figure 14:
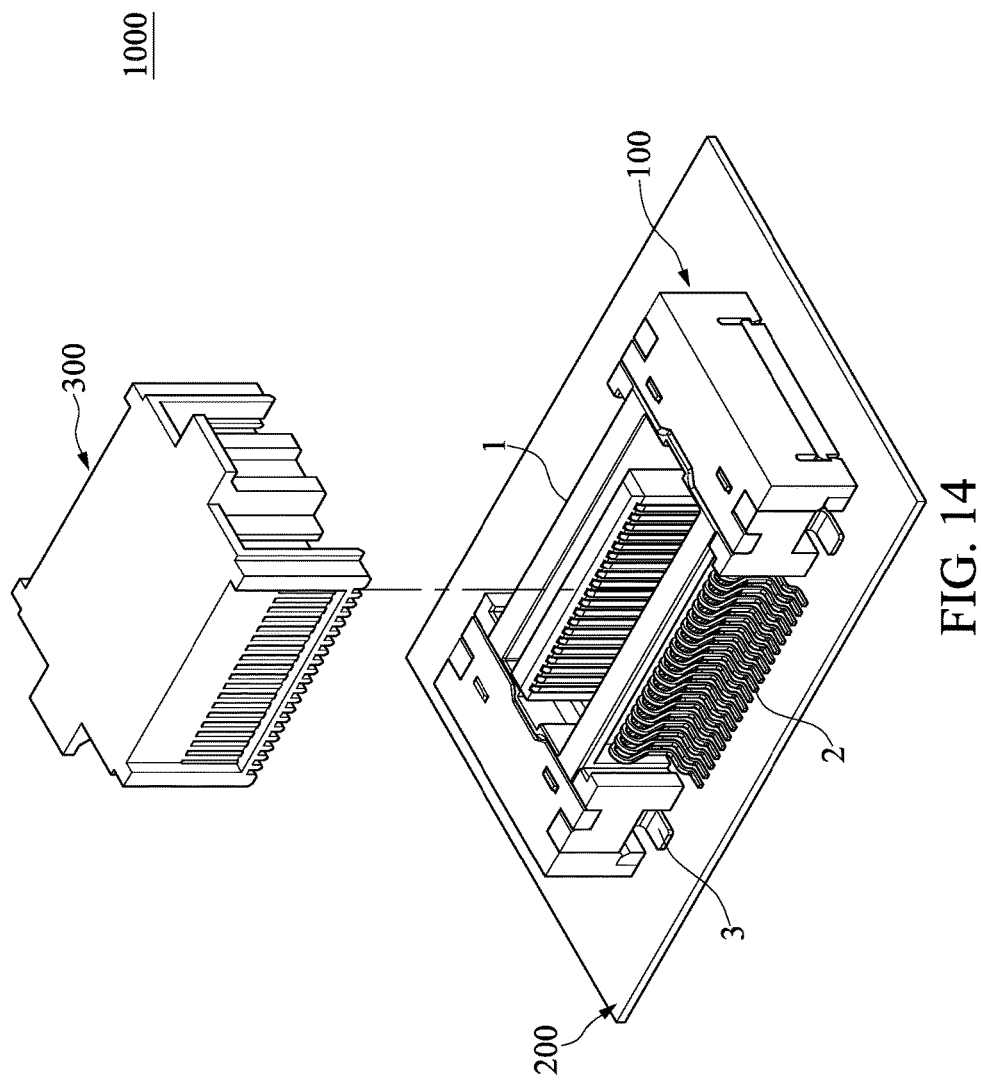
FIG. 14 is an exploded view of FIG. 13.
Figure 15:
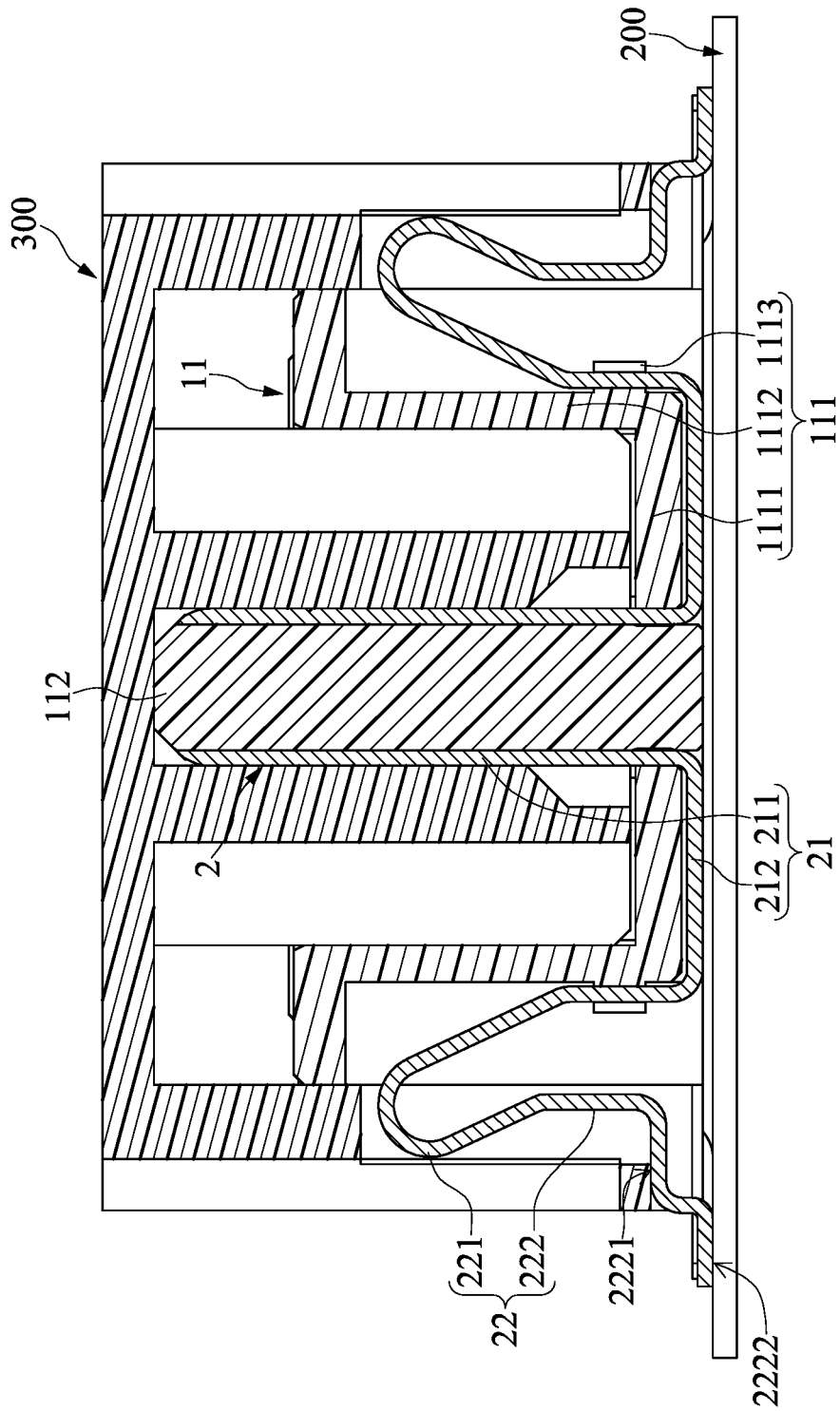
FIG. 15 is a cross-sectional view taken along the cross-sectional line XV-XV of FIG. 13.

In addition, as shown in FIGS. 13 to 15, the signal transmission assembly 1000 can further include a holder 300 for pressing the fixing surfaces 2222 of the conductive terminals 2 onto the corresponding pads of the circuit board 200. Specifically, the holder 300 is detachably inserted into the inserting portion 11 and abuts against (the step surfaces 2221 of) the second parts 22 of the conductive terminals 2, so that an end (i.e., the fixing surface 2222) of the second part 22 of each of the conductive terminals 2 is abutted against the circuit board 200. After the forming process is implemented, the holder 300 can be removed from the inserting portion 11. It should be noted that the signal transmission assembly 1000 can be provided without the holder 300.

Moreover, the holder 300 is also abutted against two board surfaces of the tongue plate 112 and the inner and outer surfaces of the two side walls 1112 of the inserting slot 111, so that the predetermined structure of the inserting portion 11 of the insulating housing 1 can be effectively maintained in the forming process.

The Effects of the Present Embodiments

In summary, the signal transmission assembly, the floating connector, and the soldering member of the present disclosure can be provided for improving the shockproof effect of the floating connector by the cooperation of the soldering member and the insulating housing, in which when the insulating housing is moved relative to the circuit board, each of the elastic arms is pressed to provide an elastic force to the insulating housing.

Moreover, the signal transmission assembly in the present disclosure can further include the holder to abut against the second parts of the conductive terminals, so that the end of the second part of each of the conductive terminals is abutted against the circuit board, thereby preventing empty soldering from occurring to the conductive terminals.

In addition, the floating connector and the conductive terminal of the present disclosure can be provided for improving the shockproof effect by the structural design of the conductive terminal. Moreover, the cooperation of the conductive terminals and the inserting portion (e.g., a part of each conductive terminal fastened to the inserting portion is only located at one side of the elastic segment, and the elastic segments of the conductive terminals are arranged outside the inserting slot) can be provided to prevent the insulating housing from limiting the performance of the conductive terminals, thereby effectively improving the shockproof effect of the floating connector.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A signal transmission assembly, comprising:
   a circuit board; and
   a floating connector fixed on the circuit board and including:
      an insulating housing including:
         an inserting portion;
         two extending portions respectively connected to two opposite sides of the inserting portion; and
         two covering portions respectively located at the two extending portions, wherein each of the two covering portions and the corresponding extending portion surround and define a limiting slot having a limiting wall and two limiting holes facing the limiting wall;
      a plurality of conductive terminals fastened to the insulating housing, wherein each of the conductive terminals includes a first part arranged in the inserting portion and a second part unconnected to the inserting portion; and
      two soldering members respectively and movably installed in the two limiting slots, wherein each of the two soldering members includes:
         a beam facing the limiting wall of the corresponding limiting slot;
         two elastic arms connected to the beam and each having a free end portion, wherein the free end portions of the two elastic arms are respectively and movably inserted into the two limiting holes of the corresponding limiting slot; and
         two soldering tails respectively connected to two opposite ends of the beam and passing through the corresponding limiting slot;
      wherein the conductive terminals and the soldering tails of the two soldering members are soldered on the circuit board, and the beam of each of the two soldering members is spaced apart from the corresponding limiting wall, wherein when the insulating housing is moved relative to the circuit board, each of the elastic arms is pressed to provide an elastic force to the insulating housing.

2. The signal transmission assembly as claimed in claim 1, further comprising a holder detachably inserted into the inserting portion and abutting against the second parts of the conductive terminals, wherein an end of the second part of each of the conductive terminals is abutted against the circuit board.

3. The signal transmission assembly as claimed in claim 1, wherein in each of the two soldering members, each of the free end portions has a thickness, is arranged away from the two soldering tails, and protrudes from the corresponding limiting hole, and each of the free end portions and an inner wall defining the corresponding limiting hole have a gap smaller than the thickness.

4. A floating connector, comprising:

an insulating housing including:
- an inserting portion;
- two extending portions respectively connected to two opposite sides of the inserting portion; and
- two covering portions respectively located at the two extending portions, wherein each of the two covering portions and the corresponding extending portion surround and define a limiting slot having a limiting wall and two limiting holes facing the limiting wall;

a plurality of conductive terminals fastened to the inserting portion of the insulating housing; and two soldering members respectively and movably installed in the two limiting slots, wherein each of the two soldering members includes:
- a beam facing the limiting wall of the corresponding limiting slot;
- two elastic arms connected to the beam and each having a free end portion, wherein the free end portions of the two elastic arms are respectively and movably inserted into the two limiting holes of the corresponding limiting slot; and
- two soldering tails respectively connected to two opposite ends of the beam and passing through the corresponding limiting slot.

5. The floating connector as claimed in claim 4, wherein each of the two soldering members is formed integrally as one piece; in each of the two soldering members, each of the elastic arms have an elastic portion connected to the beam and the free end portion, and each of the elastic arms curvedly extends from the beam and includes at least one S-shaped structure.

6. The floating connector as claimed in claim 5, wherein in each of the two soldering members, each of the free end portions is arranged away from the two soldering tails, and the free end portion and a part of the elastic portion of each of the two elastic arms are movable to insert into the corresponding limiting hole.

7. The floating connector as claimed in claim 4, wherein the inserting portion and the two extending portions are formed integrally as one piece, and the two covering portions are respectively and detachably fastened to the two extending portions.

8. The floating connector as claimed in claim 7, wherein in each of the two covering portions and the corresponding extending portion, the two limiting holes are penetratingly recessed in the covering portion, and the limiting wall is arranged on the extending portion.

* * * * *